United States Patent [19]
Wernberg et al.

[11] Patent Number: 5,258,204
[45] Date of Patent: Nov. 2, 1993

[54] CHEMICAL VAPOR DEPOSITION OF METAL OXIDE FILMS FROM REACTION PRODUCT PRECURSORS

[75] Inventors: Alex A. Wernberg; Henry J. Gysling, both of Rochester, N.Y.

[73] Assignee: Eastman Kodak Company, Rochester, N.Y.

[21] Appl. No.: 900,283

[22] Filed: Jun. 18, 1992

[51] Int. Cl.$^5$ .................... C23C 16/00; B05D 5/12
[52] U.S. Cl. ..................... 427/255; 427/108; 427/109; 427/126.3; 427/248.1
[58] Field of Search ............... 427/126.3, 255.1, 255.2, 427/255.3, 255, 109, 110, 108

[56] References Cited

U.S. PATENT DOCUMENTS

| | | | |
|---|---|---|---|
| 3,911,176 | 10/1975 | Curtis et al. | 427/248 |
| 4,485,094 | 11/1984 | Pebler et al. | 427/126.3 |
| 4,993,361 | 2/1991 | Unvala | 118/723 |
| 5,081,280 | 9/1991 | Hung | 427/226 |

OTHER PUBLICATIONS

"Preparation of Crystalline LiNbO$_3$ Films With Preferred Orientation by Hydrolysis of Metal Alkoxides", Advanced Ceramic Materials, vol. 3, No. 5, 1988, pp. 503 et seq.
B. Curtis and H. Brunner, "The Growth of Thin Films of Lithium Niobate by Chemical Vapor Deposition", Mat. Res. Bull., vol. 10, pp. 515-520, 1975.
Methrotra et al., "Alkali-metal Hexa-alkoxides of Niobium and of Tantalum", J. Chem. Soc., 1968, pp. 2673-2676.
"Metal Alkoxides as Precursors for Electronic and Ceramic Materials", Bradley, Chem. Review 1989, vol. 89, pp. 1317-1322.

Primary Examiner—Terry J. Owens
Assistant Examiner—David M. Maiorana
Attorney, Agent, or Firm—Nixon, Hargrave, Devans & Doyle

[57] ABSTRACT

Thin, uniform films of complex metal oxides are deposited by chemical vapor deposition onto a substrate by vaporizing a single source precursor, which is the reaction product of a metal M' beta-diketonate and a metal M" alkoxide, where metal M' is Li, Na, K, Ba, Mg, Ca, Sr, or Pb, and metal M" is V, Nb, Ta, or Ti, and contacting the vapor with the substrate at a temperature sufficiently high to decompose the precursor and form an M'M" metal oxide. Alternatively, compounds in which a M" metal is attached to a beta-diketonate, and an M' metal is attached to an alkoxide, are used to form the reaction product vapor precursor.

17 Claims, 1 Drawing Sheet

CHEMICAL VAPOR DEPOSITION OF METAL OXIDE FILMS FROM REACTION PRODUCT PRECURSORS

FIELD OF THE INVENTION

This invention relates to a method for depositing metal oxide films on a substrate. More particularly, this invention relates to the chemical vapor deposition of complex metal oxide films, such as lithium niobate, from a single source volatile reaction product of two compounds containing the individual metals.

BACKGROUND

Lithium niobate, $LiNbO_3$, is well known for its electrooptic, ferroelectric and piezoelectric properties, and is widely used in integrated and guided-wave optics applications, such as couplers, switches, modulators, deflectors and rf spectrum analyzers.

Although polycrystalline and single crystal $LiNbO_3$ have been prepared by a variety of standard solid state synthetic methods, relatively little work has been reported dealing with the fabrication of thin films of this material. Magnetron and rf sputtering and molecular beam epitaxy have been used to fabricate thin films of $LiNbO_3$. These techniques, however, require complicated and expensive high vacuum equipment. It is also difficult, using these processes, to maintain film uniformity over large areas. Further disadvantages are the low growth rates associated with these techniques as well as their difficulty in providing conformal coverage. Conformal coverage is the degree to which the deposition follows the contour of the substrate surface. Line of sight techniques such as sputtering typically exhibit poor conformal coverage.

In "Preparation of Crystalline $LiNbO_3$ Films with Preferred Orientation by Hydrolysis of Metal Alkoxides," Advanced Ceramic Materials, Vol. 3, No. 5, 1988, pp. 503 et. seq. a process is disclosed for preparing $LiNbO_3$ thin films using single source reagents by a sol gel process utilizing hydrolysed metal alkoxides, such as, for example, an ethanol solution of lithium ethoxide and niobium ethoxide. It is difficult to obtain epitaxial films using sol-gel deposition techniques as it is not possible to control the crystallization rate using this process.

U.S. Pat. No. 5,051,280 discloses a method for producing alkali metal niobates and tantalates which involves pyrolyzing the stoichiometric salt of an alkali metal and a niobium or tantalum complex of a bidentate or tridentate ligand. For example, the salt may be dissolved and then coated on to a substrate, after which the coating is pyrolyzed at 400° C. for 10 mins. It is difficult to obtain high quality films having monocrystallinity using such methods, due to the lack of control in the crystallization rate as well as the relatively large amount of organic material that is evolved during the processing of the coated precursor layer.

Chemical vapor deposition (CVD) is a standard technique capable of depositing films at high growth rates. CVD is also generally a more preferred process for manufacturing films, since many substrates can be coated simultaneously and uniformly, and conformal coverage is obtained more easily than with sputtering or MBE. To date there has been little work done on depositing complex metal oxide films such as $LiNbO_3$ by CVD.

One method for forming $LiNbO_3$ films by chemical vapor deposition is disclosed in U.S. Pat. No. 3,911,176 to Curtis et. al., and in "The Growth of Thin Films of Lithium Niobate by Chemical Vapor Deposition," by B. Curtis and H. Brunner, Mat. Res. Bull. Vol. 10, pp. 515–520, 1975. Both of these references disclose vaporizing separate lithium and niobium compounds and bringing the resultant vapors in contact with a heated substrate in an oxidizing atmosphere. Preferred materials for producing the vapor precursor include lithium chelates of beta-diketonates and niobium alkoxides. One disadvantage to a process such as this, which utilizes separate sources for each metal precursor, is that it is difficult to make each precursor volatilize at the same rate. Consequently, because there is usually more of one metal than the other in the precursor vapor, it is difficult to achieve the desired 1:1 stoichiometry in the resultant $LiNbO_3$ film. In addition, when dual source precursors are involved, one of the metals may deposit preferentially, leading to an undesirable film composition. Further, the films deposited using the Curtis CVD method are initially black, and therefore not useful in many electro-optic applications which require high light transmittance, until they have first been annealed. Curtis teaches that these films should be annealed at a temperature of about 700° to 1000° C. for 1 to 10 hours.

Thus, there continues to be a need for a chemical vapor deposition process that will produce lithium niobate and other complex metal oxides, which produces monocrystalline films, having an epitaxial relationship to the substrate, and preferably which does not require a subsequent annealing operation. Other common complex metal oxides which exhibit useful electrooptic, ferroelectric and piezoelectric properties include the vanadates, niobates, tantalates and titanates of alkali metals, alkaline earth metals, and lead.

RELATED PATENT APPLICATIONS

Wernberg et al., U.S. Ser. No. 07/900,135, filed concurrently herewith and commonly assigned, titled CHEMICAL VAPOR DEPOSITION OF METAL OXIDE FILMS, discloses mixing a metal M' organometallic compound and a metal M" organometallic compound wherein one of either M' or M" is Li, Na, K, Sr, Mg, Ca, Pb or Ba, and the other of either M' or M" is V, Nb, Ta, or Ti in a solution to form a single source precursor, vaporizing the single source precursor, and contacting the substrate with a vapor of the single source precursor at a temperature sufficient to decompose the precursor and deposit a metal oxide on the substrate.

BRIEF SUMMARY OF INVENTION

In accordance with the present invention, it has been discovered that thin, uniform films of complex metal oxides can be deposited by chemical vapor deposition onto a substrate by vaporizing a single source precursor which is the reaction product of a metal M' beta-diketonate and a metal M" alkoxide, where metal M' is Li, Na, K, Ba, Mg, Ca, Sr, or Pb, and metal M" is V, Nb, Ta, or Ti, and contacting the vapor with the substrate at a temperature sufficiently high to decompose the precursor and form an M'M" oxide. Alternatively, compounds in which a M" metal is attached to a beta-diketonate, and an M' metal attached to an alkoxide, can be used to form the reaction product vapor precursor.

The method of the invention is particularly useful for forming complex metal oxides of the form $M'M"O_3$, such as LiNbO3, LiTaO3, BaTiO3, KNbO3, KTaO3, PbTiO3, SrTiO3, etc. However, the method is not limited to oxides of this form. A particularly preferred embodiment of the method, used to form lithium niobate films, comprises vaporizing the reaction product of a lithium beta diketonate, Li[RC(0)CHC(0)R'], and a niobium alkoxide, Nb(OR")5, where R, R' and R"=alkyl, aryl (including substituted derivatives of said radicals) and passing the resulting vapors over a substrate heated to an appropriate temperature to allow decomposition of the precursor to produce the desired film. The actual precursor reaction product, formed in-situ, is believed to be a complex of the type LiNb(OR")5(R-C(O)CHC(O)R'). Because the metal ions in the vapor precursor have substantially the same stoichiometric ratio desired in the resultant film, the resultant film is of substantially uniform stoichiometry. Consequently, for a LiNbO3 film, for example, the resultant film is essentially stoichiometric LiNbO3 throughout the entire deposition area. The films formed by the method of the present invention are epitaxial with the substrate, of a single crystalline phase, transparent, and of generally higher quality than films produced using the techniques previously disclosed in the prior art.

DETAILED DESCRIPTION OF THE INVENTION

Figure 1:
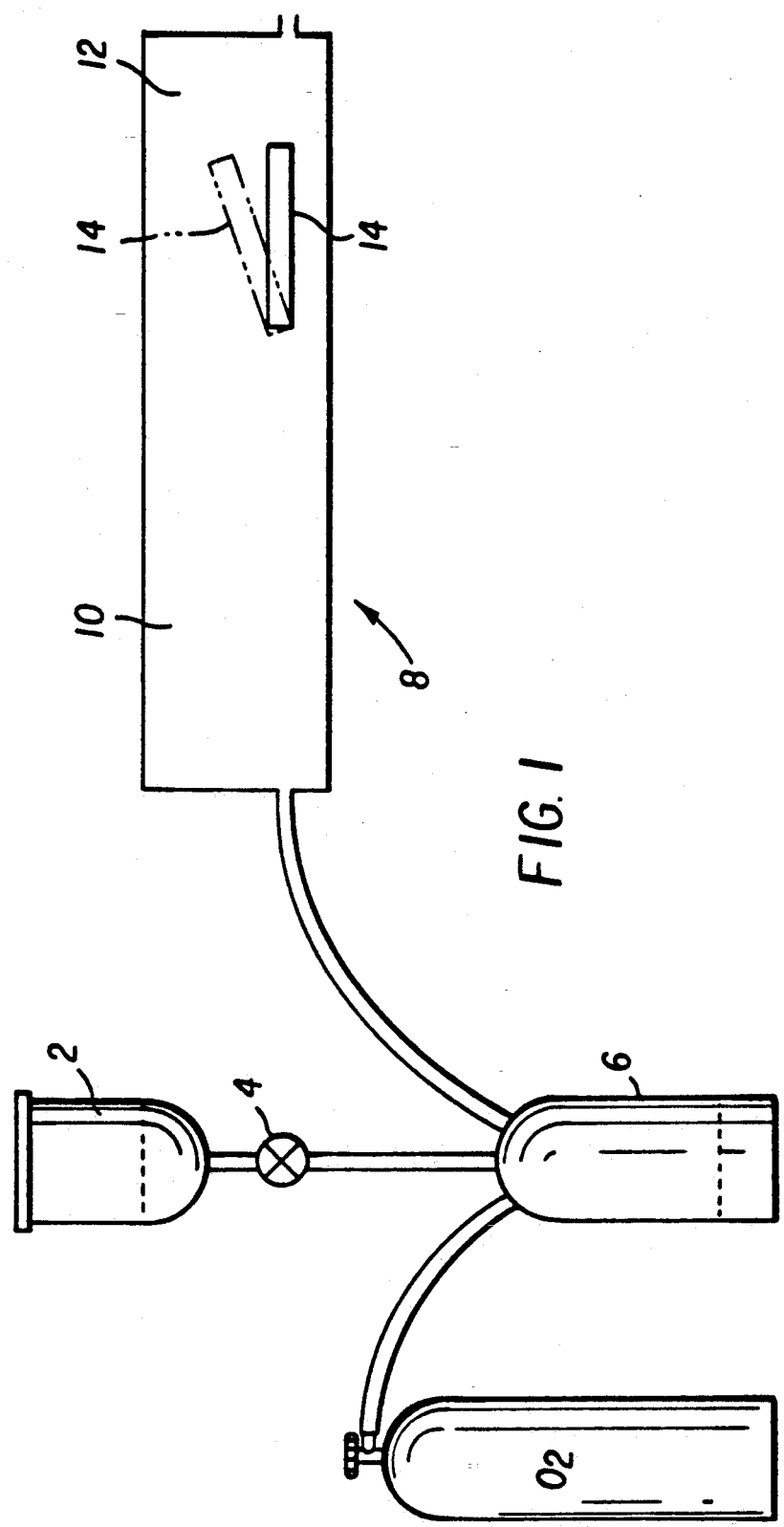
FIG. 1 shows a sectional view of an apparatus suitable for carrying out the chemical vapor deposition process in accordance with the invention.

In accordance with the present invention, complex metal oxide (i.e., oxides having more than one metal constituent) coatings are deposited by CVD using a reaction product single source precursor which contains all of the coating constituent metals in a stoichiometric relationship and which produces films with useful properties. For example, in one preferred embodiment of the invention, a reaction product single source precursor compound having a 1:1 atomic ratio of Li to Nb is used to form LiNbO3.

The use of a reaction product single source precursor results in films of very uniform composition across the surface of the substrate, with minimal preferential deposition. The films are transparent and specular, and therefor do not require a subsequent annealing operation. The films are also generally oriented and epitaxial with the substrate.

It should also be noted that by "stoichiometric film", as used herein and in the claims, it is meant that the film has substantially the same metal ratio as the precursor metal complex. Thus, for example, a LiNbO3 film having a substantially uniform and correct stoichiometry, as used herein and in the claims, has a substantially uniform and preferably a completely uniform composition of LiNbO3 across the entire surface of the substrate, and does not, for example, contain substantial areas that are rich in Li or Nb content. Thus, a resultant LiNbO3 film might consist of, for example, 45-55% Nb, and still be considered substantially stoichiometric, as used herein. More preferably, the resultant LiNbO3 film consists of between 48 and 52 percent Nb, and most preferably, in the case of a LiNbO3 film, the film is 100% LiNbO3 throughout the entire deposited area.

The reaction product single source precursor must be sufficiently soluble in an appropriate organic solvent and sufficiently volatile to allow vapor transport of the precursor compound to the heated substrate after evaporation of the carrier solvent. Although a wide variety of such compounds have potential utility, reagents containing metal-oxygen bonds are especially preferred since they incorporate the basic framework of the desired solid state material and produce LiNbO3 and other mixed oxide electrooptic ceramics at relatively low processing temperatures, with lower carbon contamination compared to other classes of precursor reagents (e.g., organometallics containing metal-carbon bonds). In addition, such precursors minimize or, ideally, eliminate the need for inclusion of oxygen in the processing atmosphere and therefore offer important safety advantages by reducing explosion hazards associated with mixtures of organic solvents and molecular oxygen.

Consideration of the properties outlined above leads to the identification of two general classes of ligands which are preferred reagents for forming the reaction product single source precursor in accordance with the invention, and particularly for LiNbO3:

1) alkoxides (M-O-Alkyl) or aryloxides (M-O-Aryl); and
2) beta-diketonates:

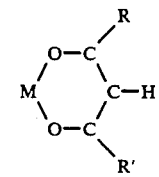

where M in either the alkoxide, aryloxide or beta-diketonate may be M' or M" as explained above.

Derivatives with alkoxide or aryloxide ligands have been reported for most of the elements in the periodic table. See, for example, Metal Alkoxides, D. C. Bradley et al., Academic Press, N.Y. (1978). By appropriate design of the steric properties of the alkyl or aryl groups as explained in "Metal Alkoxides as Precursors for Electronic and Ceramic Materials," D. C. Bradley, Chem. Rev., Vol. 89, No. 6, pp. 1317-1322 (1989), such derivatives can exhibit significant solubility in organic solvents as well as sufficient volatility.

A wide variety of chelates of beta-diketonates can likewise be prepared with symmetric (i.e., R=R') and unsymmetric (R≠R') diketonate ligands. Fluorinated beta-diketonates have been shown to exhibit significantly enhanced volatility as compared to their hydrocarbon analogs. Some common members of the beta-diketonate ligand class, along with their trivial and systematic names, are listed below:

| SYMMETRICAL BETA-DIKETONATE LIGANDS | |
|---|---|
| R = R' | |
| Me | acetylacetonato (acac) |
|  | 2,4 pentanedionato |
| CF3 | hexafluoroacetylacetonato (hfa) |
|  | 1,1,1,5,5,5-hexafluoro-2,4-pentanedionato |
| t-butyl | dipivaloylmethanato |
|  | 2,2,6,6-tetramethyl-3,5-heptanedionato |
| Ph | dibenzoylmethanato |
|  | 1,3-diphenyl-1,3-propanedionato |
| UNSYMMETRICAL BETA-DIKETONATE ligands | |
| R ≠ R' | |
| CH3  CF3 | trifluoroacetylacetonato (tfa) |
| t-Bu  n-C3F7 | 1,1,1,2,2,3,3-heptafluoro-7,7-dimethyl-4,6-octanedionato (fod) |
| CF3  2-thienyl | thenoyltrifluoroacetonato |

-continued 4,4,4-trifluoro-1-(2-thienyl)-1-
3-butanedionato

Thus, the preferred ligands are the beta-diketonates and alkoxides or aryloxides. Consequently, in accordance with a preferred embodiment of the invention, two reagents, one a beta-diketonate and the other an alkoxide or aryloxide, are reacted to form a reaction product. For example, the reaction of niobium alkoxides, $Nb(OR)_5$ with lithium beta-diketonates gives mixed derivatives of the type $LiNb(OR)_x(R'C(O)CH-C(O)R'')_{6-x}(10)$, where x is from 1 to 5.

By reacting the metal M' beta-diketonate with the metal M'' alkoxide, a soluble reaction product is formed which contains metal M' and M'' in the correct stoichiometric ratio (1:1) desired in the resultant oxide film. The reaction product is then atomized and/or vaporized to form a reaction product single source vapor precursor.

In some applications, the precursor solution could be obtained by dissolving solid components which contain the desired stoichiometric ratio of metal constituents in a suitable solvent. However, in many applications, the process of forming the vapor precursor is more complicated. In a preferred embodiment of the present invention which is used to deposit $LiNbO_3$, for example, in the preparation of precursors for use in depositing $LiNbO_3$, Li dipivaloylmethanate (LiDPM) would not dissolve in toluene. However, if the LiDPM is mixed with niobium ethoxide and toluene and then heated to the boiling point of toluene, after a short period of time a reaction product is formed which is soluble in the toluene solvent even at ambient temperature. This solution is then atomized or vaporized using conventional methods, such as, for example, an ultrasonic nebulizer. The single source vapor precursor is then transported to the substrate using any transport method conventionally utilized in CVD operations, such as, for example, by $O_2$ or an inert carrier gas. To form an oxide coating, the single source vapor precursor may be contacted with the substrate in an oxidizing atmosphere and at a temperature sufficient to decompose the precursor, leaving a film of the form $M'M''O_3$ on the substrate. Alternatively, if there is enough oxygen present in the volatile precursor reagent, an oxidizing atmosphere may not be necessary, and the reaction may take place in an inert atmosphere.

Suitable metal combinations for forming complex metal oxides in accordance with the invention are listed as follows:

| Metal M' | Metal M'' |
| --- | --- |
| Li, Na, K | V, Nb, Ta |
| Pb, Ba, Sr, Ca, Mg | Ti |

Although the present invention is particularly suited to forming oxides of the form $M'M''O_3$, complex metal oxides as used herein is meant to include any metal oxide in which there are two or more metal ions. The reagent compounds of the present invention preferably include, for example, a metal M' beta-diketonate and a metal M'' alkoxide, metal M' and metal M'' being selected from the groups and combinations listed above. However, it should be noted that the above list of metals is given for example only, and is not meant to limit the invention. Further, it should be noted that the above-mentioned ligands can be attached to the respective M' and M'' metals in the opposite order, that is, by using a metal M' alkoxide and a metal M'' beta-diketonate, to form the reaction product.

The method of the invention is not limited to producing oxides of the form $M'M''O_3$, but is applicable to form any oxide having more than one metal in its composition, so long as a single source precursor reaction product can be formed having the desired metal ratio and being sufficiently soluble and volatile to be operable.

The method can also be used to form oxides of the form $M'M''M'''O_x$, such as, for example, lead zirconate tanate (PZT). In such an application, two of the metals are incorporated into one single source precursor reaction product in accordance with the present invention, and a second precursor containing the third metal is then combined therewith to deposit the $PbZrTiO_3$ film by CVD.

A preferred CVD apparatus suitable for use in the method of the invention is illustrated in FIG. 1, although other conventional CVD apparatus can also be utilized. Referring to FIG. 1, a storage reservoir 2 is provided for in a suitable solvent. The reaction product solution is then dispensed from storage reservoir 2 by appropriately adjusting a valve 4, whereupon the reaction product solution is transported, in this case via gravity, to an atomization or nebulization chamber 6.

Alternatively, the reaction product solution may be placed directly into the atomization or nebulization chamber 6. The chamber 6 consists of any conventional means for converting the liquid reaction product solution to a mist, such as, for example, an ultrasonic nebulizer. The reaction product solution is atomized in nebulization chamber 6, forming a single-source precursor mist. This atomized mist is then transported, using a suitable carrier gas, to a reactor 8, which has a low temperature zone 10 and a high temperature zone 12. The low temperature zone 10 is held at a high enough temperature to immediately volatilize the single-source procursor mist, forming a single-source precursor vapor of the reaction product. The high temperature zone 12 is held at a temperature high enough to decompose the reaction-product, and allow the metal M' and metal M'' ions to react and form a complex metal oxide film on the substrate 14 located therein. The substrate 14 may be oriented horizontally or, preferably, is tilted toward the incoming precursor vapor, as illustrated in FIG. 1.

Substrates suitable for use in this process ideally are stable up to about 1000° C. Most common substrates used in electro-optic technology can be used including single crystal and polycrystalline substrates. Suitable substrates include, for example, silicon, germanium, Group III-V semiconductor substrates such as gallium arsenide, platinum foil, yttrium aluminum garnet, spinel, sapphire, lithium niobate, lithium tantalate, magnesium oxide and strontium titanate.

The reaction may be carried out in a wide variety of apparatus and under varying reaction conditions. A carrier gas, which may or may not include oxygen, may be used or the reaction may take place at reduced pressure. Reaction temperatures, pressures and times may be varied.

The invention may be more easily comprehended by reference to the following specific examples, the first example illustrating the method of the invention.

EXAMPLE 1

Preparation of lithium niobate films according to the invention using the precursor formed from the reaction of a lithium beta-diketonate and niobium alkoxide.

In accordance with the invention, niobium ethoxide, $Nb(OC_2H_5)_5$, was obtained commercially (Aldrich Chemicals) and lithium dipivaloylmethanate (LiDPM) $Li[t-C_4H_9C(O)CHC(O)t-C_4H_9]$ was prepared by addition of concentrated ammonia to an ethanol solution of LiCl and a stoichiometric amount of the parent beta-diketone. A white LiDPM precipitate was formed, which was filtered, washed with a small volume of anhydrous ether and purified by vacuum sublimation at 200° C. and $10^{-3}$ mm Hg pressure. Under the dry, oxygen free atmosphere of a glove box, 150 mg of the LiDPM was added to 200 ml of a 0.01M solution of niobium ethoxide dissolved in toluene. Without heating, the LiDPM would not dissolve, even after prolonged standing. However, on refluxing, the insoluble lithium beta-diketonate slowly reacted with the niobium ethoxide, forming a reaction product after about 30 minutes which was completely soluble in the toluene solvent. On allowing the reaction product to cool to ambient temperatures, no precipitation occurred, resulting in a toluene solution of reaction product containing both Li and Nb in substantially a 1:1 stoichiometry. In the absence of niobium ethoxide, LiDPM did not dissolve in boiling toluene.

The solution containing the reaction product was transferred to the ultrasonic nebulization chamber 6, as shown in FIG. 1, removed from the glove box and then connected to reactor 8. Chamber and reactor 8 were then purged with a carrier gas consisting of a mixture of 6% oxygen in argon, and reactor 8 heated to the desired operating temperature. Low temperature zone 10 of reactor 8 was heated to 360° C. while high temperature zone 10, which contained a (1102) sapphire substrate 12 was heated to 506° C. On temperature equilibration of the reactor 8 and substrate 12, the solution was atomized in nebulization chamber 6 and transported into the reactor by the carrier gas flowing at 3.5 SLM. After deposition for thirty minutes, the atomization was discontinued and the reactor allowed to cool under the oxygen/argon flow. Films formed under these conditions were transparent and specular. X-ray diffraction analyses of these films detected only an (012) oriented phase of lithium niobate. This infers a uniform correct stoichiometry across the entire surface of the substrate.

EXAMPLE 2

Preparation of lithium niobate films on (0001) sapphire substrates. The conditions of preparation of the films were the same as in Example 1 except that the temperature of the first zone was maintained at 280° C. while the zone containing the (0001) sapphire substrate was heated to 540° C. Under these conditions, a 0.3 μm thick film having a uniform composition of stoichiometric $LiNbO_3$ was obtained after forty five minutes growth. Analyses of the transparent, specular film by x-ray diffraction, including rocking curve and pole figure analyses, indicated that the films were of a very high crystalline quality and had grown in an epitaxial relationship with the substrate. The films were also analyzed by Rutherford backscattering. Using this method of analysis, the minimum channeling yield (ratio of aligned backscattering yield to the random yield) was found to be 60%, confirming the high epitaxial nature of the films.

The following example, provided for comparison, illustrates that there are stoichiometric Li and Nb single source compounds which, unlike the precursor described in Examples 1 and 2, are unsuitable for use as volatile precursors for $LiNbO_3$ films.

COMPARATIVE EXAMPLE 1

Preparation of lithium niobate films from the precursor $LiNb(OC_2H_5)_6$.

There are many compounds which contain both Li and Nb and yet are not suitable for CVD deposition in accordance with the invention. For example, 0.6 g of the precursor $LiNb(OC_2H_5)_6$ was dissolved in 150 ml of ethanol and the solution made up to 300 ml by addition of toluene. Handling of the precursor and preparation of the solution was done under the inert atmospheric conditions of a glove box. The solution was atomized and the resulting mist transferred into the reactor using a flow of carrier gas as described in Example 1. However, no evidence of film formation was detected on the sapphire substrate.

The next example, also provided for comparison, illustrates the non-uniformity of deposition which can result from merely using a vapor containing separate lithium and niobium precursors.

COMPARATIVE EXAMPLE 2

Preparation of lithium niobate films from the separate precursors $Li(O-t-C_4H_9)$ and $Nb(O-C_2H_5)_5$.

Mixing of separate Li and Nb compounds into a solvent (without first forming a single source reaction product) and vaporization of the resultant mixture does not necessarily achieve the same results as the present invention. For example, a toluene solution containing 0.01M each of $Li(O-t-C_4H_9)$ and $Nb(O-C_2H_5)_5$ was atomized and the resulting mist passed into the reactor and over the sapphire substrate as described in Example 1. The thin film that formed on the sapphire substrate was not visually uniform. The substrate was diced into 1 cm sections and the resultant pieces analyzed for crystalline phases and elemental composition. The film that was formed closest to the entrance of the reactor was found to contain oriented lithium niobate as the only detectable crystalline phase. However, the ratio of lithium to niobium in this section of film was 6:4 as determined by inductively coupled plasma optical absorption spectroscopy (ICP). The only phase detected in the film obtained in the second section of substrate was a polycrystalline lithium niobate phase. ICP analysis indicated that the film in this portion was lithium deficient, the ratio of lithium to niobium being 3.5:6.5. Films formed farther along on the substrate contained decreasing ratios of lithium to niobium with no crystalline phases being detected by XRD. Films formed on the substrate farthest away from the entrance of the reactor contained niobium only. Thus, even though an attempt was made to provide a solution having a 1:1 metal ratio, because the metals were not contained in the same molecular precursor, lithium had an opportunity to react preferentially, which it did, resulting in a film having higher lithium content nearer the entrance to the reactor.

EXAMPLE 3

Preparation of lithium tantalate thin films on (0001) sapphire substrates. The condition for the preparation of the films were the same as for Example 1, except that 380 mg of lithium DPM and 812 mg of tantalum pentaethoxide were used to prepare 200 ml of the precursor solution in toluene. The temperature of the first heated zone was maintained at 280° C. while the zone containing the (0001) sapphire substrate was maintained at 659° C. The transparent, reflective films obtained under these conditions were analyzed by x-ray diffraction analyses, including rocking curve and pole figure analyses. These analyses showed that the films contained only LiTaO$_3$ (thus the films were of a uniform and correct stoichiometry across the entire substrate surface) and that the films were epitaxially oriented with respect to the (0001) sapphire substrate. The 50% minimum channeling yield obtained from the Rutherford backscattering analysis, confirmed the high epitaxial nature of the film.

EXAMPLE 4

Preparation of potassium tantalate thin films on (0001) sapphire substrates. The condition for the preparation of the films were the same as for Example 1, except that 229 mg of potassium DPM and 406 mg of tantalum pentaethoxide were used to prepare 100 ml of the precursor solution in toluene. The temperature of the first heated zone was maintained at 300° C. while the zone containing the (0001) sapphire substrate was maintained at 595° C. The transparent, reflective films obtained under these conditions were annealed at 675° C. for two hours. The annealed film was analyzed by x-ray diffraction analyses, which indicated that only a single phase of polycrystalline KTaO$_3$ was present.

The invention has been described in detail with particular reference to preferred embodiments thereof, but it will be understood that variations and modifications can be effected within the spirit and scope of the invention.

We claim:

1. A method for depositing an oxide film on a substrate, which comprises:
   reacting a metal M' beta-diketonate and a metal M" alkoxide to form a reaction product single source precursor, wherein one of either M' or M" is Li, Na, K, Mg, Ca, Sr, Ba, or Pb, and the other of either M' or M" is V, Nb, Ta or Ti,
   vaporizing said single source precursor, and
   contracting said substrate with the vapor of said single source precursor at a temperature sufficient to decompose said precursor and deposit an oxide of the form M'M"O$_3$ on said substrate.

2. A method according to claim 1, wherein said substrate is contacted with said vapor in an oxidizing atmosphere.

3. A method according to claim 1, wherein said deposited oxide film has a substantially uniform composition on said substrate.

4. A method according to claim 1, wherein said oxide film has a substantially uniform and correct stoichiometry.

5. A method according to claim 1, wherein the vapor of said precursor contacts said substrate in the presence of a second vapor precursor.

6. A method according to claim 1, wherein said oxide film is substantially monocrystalline.

7. A method for depositing an oxide film of the composition M'M"O$_3$ on a substrate, which comprises:
   vaporizing a single source precursor compound of the general formula M'M" (OR)$_x$ (R'C(O)CHC(O)R")$_{6-x}$, wherein one of either M' or M" is an alkali, alkaline earth metal or lead, and the other of either M' or M" is V, Nb, Ta or Ti, R and R' and R" are alkyl, aryl or substituted alkyl or aryl, and x is from 1 to 5, and
   contacting said substrate with the vapor of said single source precursor at a temperature sufficient to decompose said precursor and form an oxide film of the form M'M"O$_3$ on said substrate.

8. A method according to claim 7, wherein said substrate is contacted with said vapor in an oxidizing atmosphere.

9. A method according to claim 7, wherein said oxide film has a substantially uniform composition.

10. A method according to claim 7, wherein said oxide film has a substantially uniform and correct stoichiometry.

11. A method for depositing an oxide film of LiNbO$_3$ on a substrate, which comprises:
    reacting a lithium beta diketonate and a niobium alkoxide to form a reaction product which is a single source precursor,
    vaporizing said single source precursor, and
    contacting said substrate with the vapor of said single source precursor at a temperature sufficient to decompose said precursor and form a film of LiNbO$_3$ on said substrate.

12. A method according to claim 11, wherein said substrate is contacted with said vapor in an oxidizing atmosphere.

13. A method according to claim 11, wherein said oxide film has a substantially uniform composition.

14. A method according to claim 11, wherein said oxide film has a substantially uniform and correct stoichiometry.

15. A method according to claim 11, wherein said lithium beta diketonate and said niobium alkoxide are reacted in an equimolar ratio.

16. A method for depositing an oxide film on a substrate, which comprises:
    vaporizing a single source precursor which is a reaction product of a metal M' beta-diketonate and a metal M" alkoxide, wherein one of either M' or M" is Li, Na, K, Sr, Mg, Ca, Pb, or Ba, and the other of either M' or M" is V, Nb, Ta, or Ti, and
    contacting said substrate with the vapor of said single source precursor at a temperature sufficient to decompose said precursor and form an oxide film of the form M'M"O$_3$ on said substrate.

17. A method according to claim 16, wherein said substrate is contacted with said vapor in an oxidizing atmosphere.

* * * * *